(12) United States Patent
Holme et al.

(10) Patent No.: US 8,278,647 B2
(45) Date of Patent: Oct. 2, 2012

(54) QUANTUM DOT TRANSISTOR

(75) Inventors: Timothy P. Holme, San Francisco, CA (US); Friedrich B. Prinz, Woodside, CA (US); Xu Tian, San Jose, CA (US)

(73) Assignees: The Board of Trustees of the Leland Stanford Junior University, Palo Alto, CA (US); Honda Motor Co., Ltd, Tokyo (JP)

( * ) Notice: Subject to any disclaimer, the term of this patent is extended or adjusted under 35 U.S.C. 154(b) by 189 days.

(21) Appl. No.: 12/657,225

(22) Filed: Jan. 15, 2010

(65) Prior Publication Data

US 2010/0181551 A1    Jul. 22, 2010

Related U.S. Application Data

(60) Provisional application No. 61/205,338, filed on Jan. 16, 2009.

(51) Int. Cl.
*H01L 29/06* (2006.01)

(52) U.S. Cl. ............... 257/20; 257/25; 257/E29.242

(58) Field of Classification Search ............ 257/20, 257/25, E29.242
See application file for complete search history.

(56) References Cited

U.S. PATENT DOCUMENTS

| | | | |
|---|---|---|---|
| 5,714,766 A | 2/1998 | Chen et al. | |
| 5,889,288 A | 3/1999 | Futatsugi | |
| 6,335,245 B2 | 1/2002 | Park et al. | |
| 6,998,310 B2 | 2/2006 | Fraboulet et al. | |
| 7,105,874 B2 | 9/2006 | Chae et al. | |
| 7,414,260 B2 | 8/2008 | Sandhu | |
| 2005/0045871 A1* | 3/2005 | Sandhu | 257/25 |
| 2005/0184285 A1 | 8/2005 | Friesen et al. | |

FOREIGN PATENT DOCUMENTS

WO    WO 2005/089165    9/2005

OTHER PUBLICATIONS

Stokes et al., "Controlled fabrication of single electron transistors from single-walled carbon nanotubes", 2008, pp. 262107-1 to 262107-3, Applied Physics Letters v92.

* cited by examiner

*Primary Examiner* — Lex Malsawma
(74) *Attorney, Agent, or Firm* — Lumen Patent Firm

(57) ABSTRACT

One or more quantum dots are used to control current flow in a transistor. Instead of being disposed in a channel between source and drain, the quantum dot (or dots) are vertically separated from the source and drain by an insulating layer. Current can tunnel between the source/drain electrodes and the quantum dot (or dots) by tunneling through the insulating layer. Quantum dot energy levels can be controlled with one or more gate electrodes capacitively coupled to some or all of the quantum dot(s). Current can flow between source and drain if a quantum dot energy level is aligned with the energy of incident tunneling electrons. Current flow between source and drain is inhibited if no quantum dot energy level is aligned with the energy of incident tunneling electrons. Here energy level alignment is understood to have a margin of about the thermal energy (e.g., 26 meV at room temperature).

16 Claims, 5 Drawing Sheets

QUANTUM DOT TRANSISTOR

CROSS REFERENCE TO RELATED APPLICATIONS

This application claims the benefit of U.S. provisional patent application 61/205,338, filed on Jan. 16, 2009, entitled "Quantum Dot Transistor", and hereby incorporated by reference in its entirety.

FIELD OF THE INVENTION

This invention relates to transistors.

BACKGROUND

The use of quantum confinement effects to improve electronic device performance has been under extensive investigation for some time. Quantum dot transistors are one example of such devices. A quantum dot transistor includes one or more quantum dots. Here, the term "quantum dot" refers to structures having 3-D quantum confinement.

The device of U.S. Pat. No. 5,714,766 is an example of a quantum dot transistor. In this device, current flow in a channel between a source and a drain is controlled with both a gate and a quantum dot. The quantum dot is electrostatically coupled to the channel via Coulomb blockade. The threshold voltage (i.e., the gate voltage at which the channel becomes conductive) depends on the number of charges stored on the quantum dot.

Another example is provided by U.S. Pat. No. 7,105,874. In this device, a quantum dot can be formed in a channel between the source and drain of a transistor during device operation. More specifically, carriers can be trapped to form accumulation and inversion layers that provide energy barriers for quantum confinement, thereby effectively forming a quantum dot. The energy levels of the resulting quantum dot can be used to control current flow through the channel.

SUMMARY

In the present approach, one or more quantum dots are used to control current flow in a transistor. Instead of being disposed in a channel between source and drain, the quantum dot (or dots) are vertically separated from the source and drain by an insulating layer. Current can tunnel between the source/drain electrodes and the quantum dot (or dots) by tunneling through the insulating layer. Quantum dot energy levels can be controlled with one or more gate electrodes capacitively coupled to some or all of the quantum dot(s). Current can flow between source and drain if a quantum dot energy level is aligned with the energy of incident tunneling electrons. Current flow between source and drain is inhibited if no quantum dot energy level is aligned with the energy of incident tunneling electrons. Here energy level alignment is understood to have a margin of about the thermal energy (e.g., 26 meV at room temperature).

DETAILED DESCRIPTION

Figure 1A:
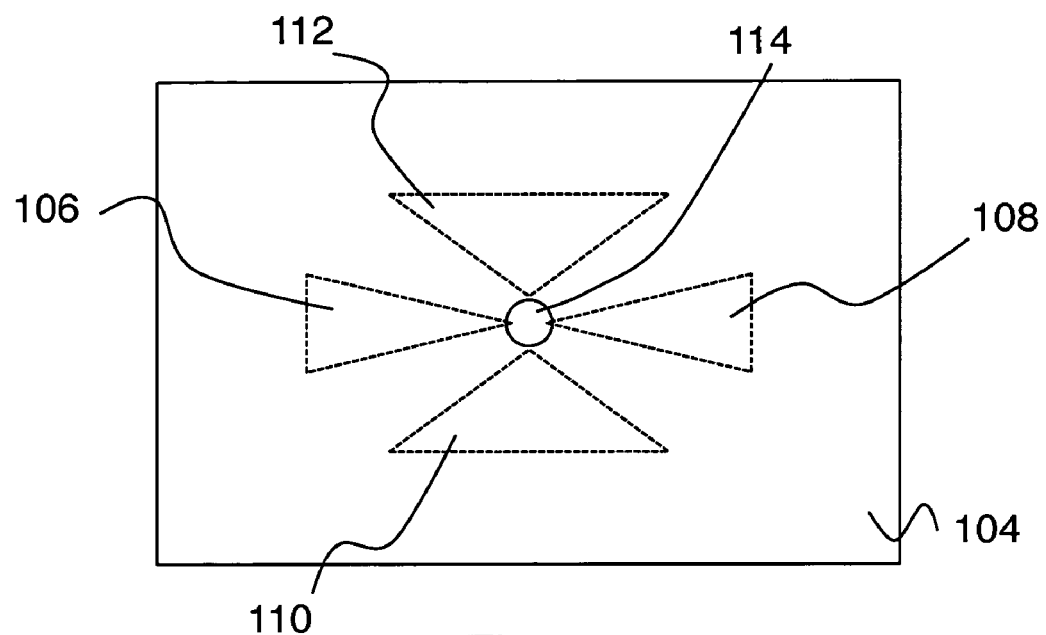
FIGS. 1a-b show top and side views of an embodiment of the invention.
Figure 1B:
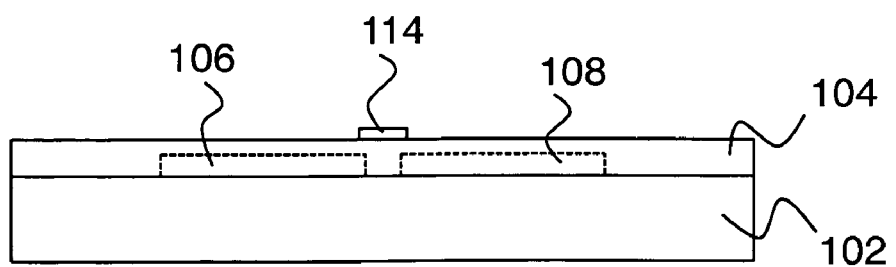

FIGS. 1a-b show top and side views of an embodiment of the invention. In this example, a source electrode 106 and a drain electrode 108 are disposed on a top surface of a substrate 102. An insulating layer 104 is disposed on the top surface of substrate 102, and covers part or all of the source and drain electrodes 106 and 108. A quantum dot 114 is disposed on a top surface of insulating layer 104. Gate electrodes 110 and 112 are disposed on substrate 102 and are capacitively coupled to quantum dot 114. In the side view of FIG. 1b, gate electrode 110 is not shown in order to provide a more clear view of the current conduction path in this device.

There is no direct path for current to flow between source electrode 106 and drain electrode 108, because the material in between these electrodes is layer 104, which is electrically insulating. Instead, current can flow between source electrode 106 and drain electrode 108 by tunneling through insulating layer 104 to/from quantum dot 114.

Quantum dot 114 has discrete energy states that electrons are allowed to occupy. When the energy level of a material near quantum dot 114 is equal to an allowed energy level in the quantum dot, electrons may pass back and forth via tunneling. Quantum mechanical tunneling of electrons through an energy barrier can occur if the tunneling distance is not too large and the barrier height is not too great. For semiconductor devices, suitable tunneling distances and barrier heights to allow substantial flow of tunneling current are known in the art. Here, the tunneling distance is the vertical separation between quantum dot 114 and electrodes 106/108. Preferably, the tunneling distance is in a range from 0.3 nm to 10 nm. It is advantageous to have the tunneling distance be a vertical dimension, as in the present approach, because vertical dimensions in fabrication can usually be more precisely controlled than lateral dimensions.

Due to the thermal energy, the requirement of equality between energy states may be relaxed to a range of an energy band of width ~kT, where k is Boltzmann's constant. For room temperature operation, the separation of discrete quantum dot energy states is preferably greater than or equal to kT=26 meV, and is more preferably greater than or equal to 3 kT=78 meV. As a quantum dot shrinks in size, the energy level spacing grows, which is why a small (i.e., 1 nm to 20 nm) quantum dot is preferred. A high on/off current ratio can be provided by separation of quantum dot energy levels of more than kT.

If two metal electrodes (e.g., source electrode 106 and drain electrode 108) are close to quantum dot 114, and the metal electrodes have an energy level within kT of an unoccupied energy level in quantum dot 114, an electron may tunnel from source electrode 106 to quantum dot 114 and then to drain electrode 108. If electrons in the metal electrodes 106 and 108 are not within kT of an unoccupied energy level in quantum dot 114, tunneling is inhibited. Therefore, switching can be effected by changing the relative position of energy levels of the metal electrodes and quantum dot 114. As in a resonant tunneling diode, very high speeds may be obtained since tunneling through very thin layers happens very quickly.

One or more gate electrodes can be employed to tune the energy levels of the quantum dot relative to the source/drain electrodes. By applying a voltage to a gate electrode near the quantum dot, the energy levels of the quantum dot can be changed. In this example, gate electrodes 110 and 112 provide such control of the quantum dot energy levels, and allow for switching the device from a conductive state (energy levels align, tunneling possible) to a non-conductive state (energy levels misaligned, tunneling inhibited). Gate electrodes 110 and 112 are capacitively coupled to quantum dot 114. This arrangement is preferred, since a direct connection to quantum dot 114 would reduce the quantum confinement provided by dot 114, and introduce undesirable perturbations in the device (e.g., energy level shifts and/or broadening).

Practice of the invention does not depend critically on the materials employed. Quantum dot 114 can be fabricated from materials which are metallic in bulk or semi-conducting in bulk. In either case, the discrete and un-occupied quantum dot energy levels that are needed can arise at sufficiently small dimensions. Electrodes 106, 108, 110, 112 can be fabricated from any convenient electrical conductor, including but not limited to: Al, Cu, Ni, Pt, Au, or any mixture or alloy thereof. Insulating layer 104 can be made from any electrical insulator capable of being deposited with the necessary precision, including but not limited to: $SiO_2$, $Al_2O_3$, $ZrO_2$, $HfO_2$, $TiO_2$, or any compound thereof. Substrate 102 can be any electrical insulator.

Practice of the invention also does not depend critically on the fabrication methods employed. Electrodes can be made by electron beam lithography or other methods capable of depositing ultra-small lines, including patterning with atomic force microscopy (AFM) methods. The electrodes can also be made by controlled growth of metal nanowires or carbon nanotubes. Quantum dots can be deposited by Langmuir, Langmuir-Blodgett, layer-by-layer, AFM, stamping, or other quantum dot deposition methods.

Figure 2A:
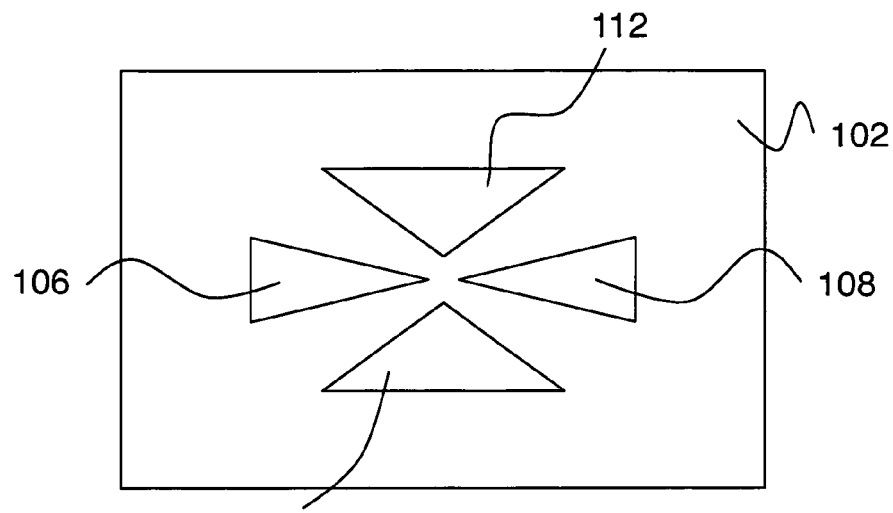
FIGS. 2a-c show top views of an exemplary fabrication sequence.
Figure 2B:
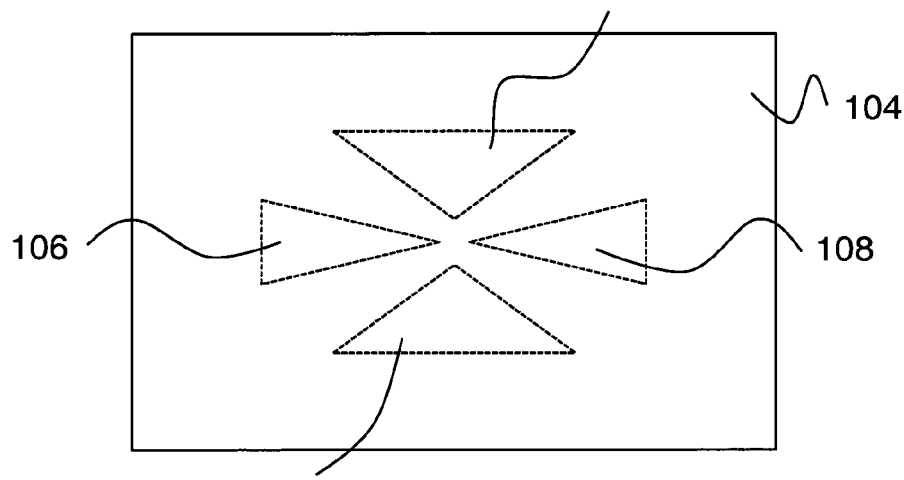
Figure 2C:
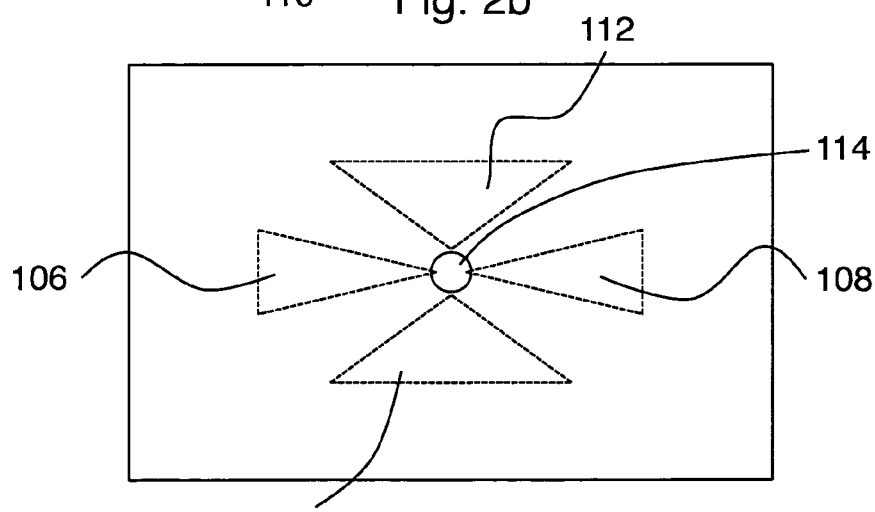
Figure 3A:
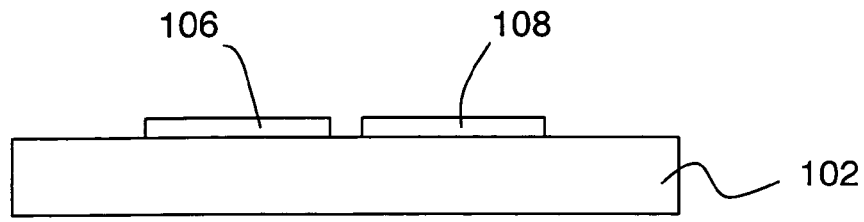
FIGS. 3a-c show side views corresponding to the top views of FIGS. 2a-c.
Figure 3B:
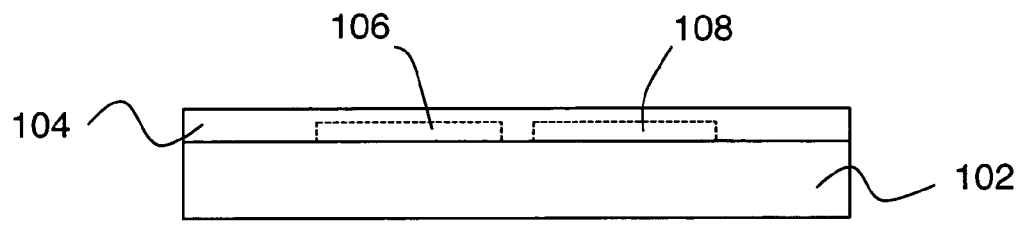
Figure 3C:
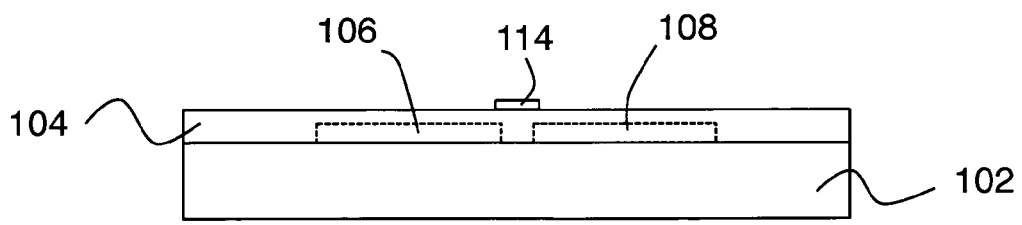

FIGS. 2a-c show top views of an exemplary fabrication sequence. FIGS. 3a-c show side views corresponding to the top views of FIGS. 2a-c. In this example, electrodes 106, 108, 110, and 112 are first deposited on substrate 102 (FIGS. 2a and 3a). Next, insulating layer 104 is deposited on top of substrate 102 and part or all of the electrodes (FIGS. 2b and 3b). Finally, quantum dot 114 is deposited on top of insulating layer 104 (FIGS. 2c and 3c). Optionally, a capping layer (not shown) of an insulator can be deposited on top of the device, to cover the quantum dot.

Figure 4A:
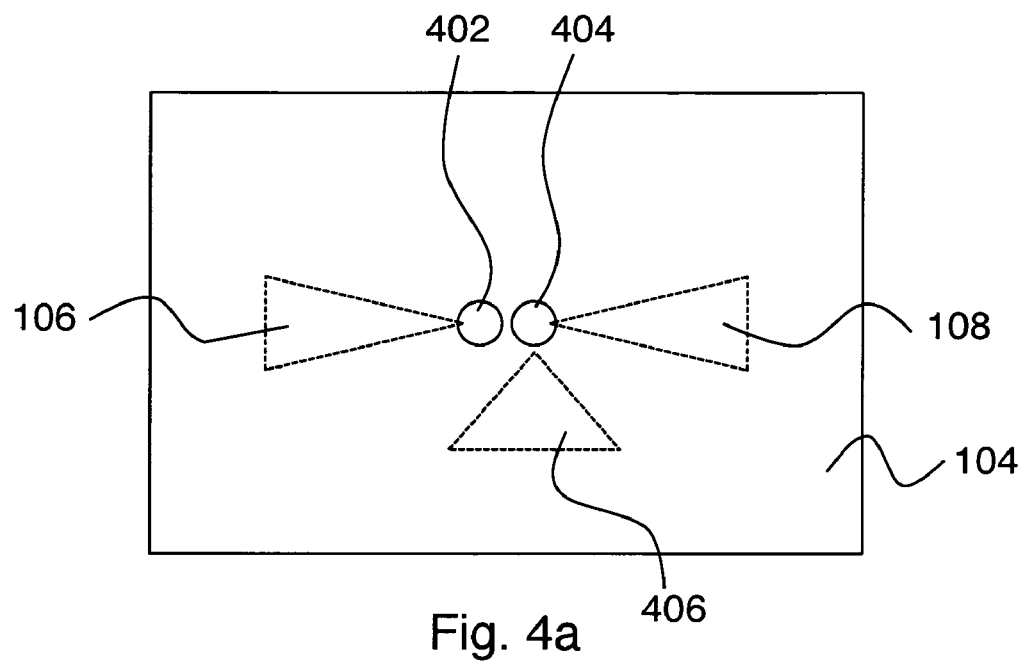
FIGS. 4a-b show top views of exemplary embodiments of the invention having more than one quantum dot.
Figure 4B:
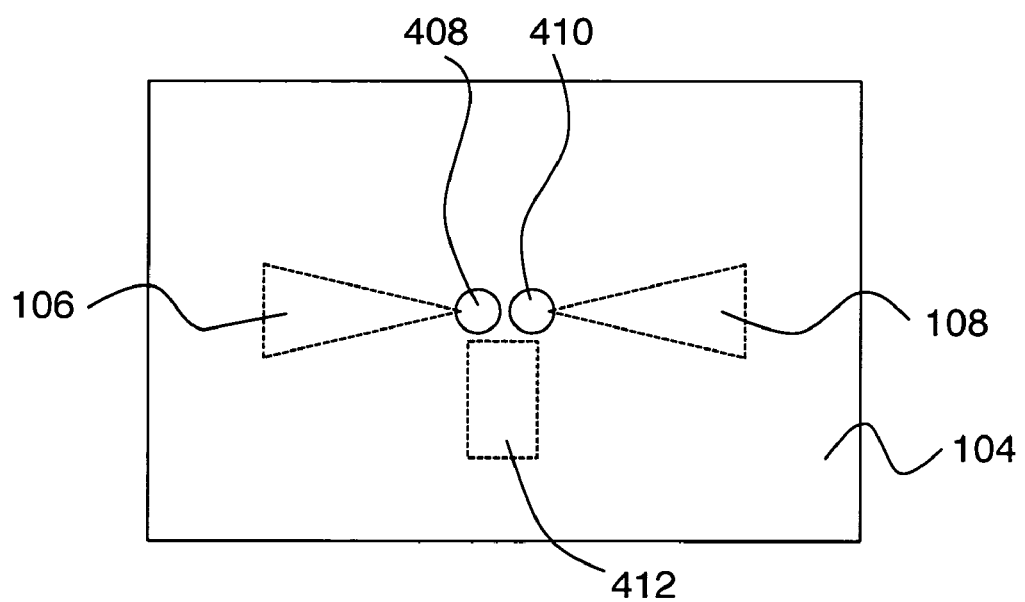

In some embodiments, more than one quantum dot is employed. FIGS. 4a-b show top views of exemplary embodiments of the invention having more than one quantum dot. In the example of FIG. 4a, there are two quantum dots 402 and 404. Quantum dot 404 is controlled by gate electrode 406. Current flow between source 106 and drain 108 proceeds by tunneling from source 106 to quantum dot 402, then by tunneling from quantum dot 402 to quantum dot 404, then by tunneling from quantum dot 404 to drain 108. Here quantum dot 402 is designed such that it has an energy level aligned with source 106, and switching is provided by controlling the energy levels of quantum dot 404 with gate electrode 406.

In the example of FIG. 4b, there are two quantum dots 408 and 410. Quantum dots 408 and 410 are both controlled by gate electrode 412. Current flow between source 106 and drain 108 proceeds by tunneling from source 106 to quantum dot 408, then by tunneling from quantum dot 408 to quantum dot 410, then by tunneling from quantum dot 410 to drain 108. Here switching is provided by controlling the energy levels of quantum dots 408 and 410 with gate electrode 412. These examples show devices having two quantum dots. Any number of quantum dots can also be employed. Quantum dot energy levels can be controlled by gate electrodes individually (i.e., one gate per quantum dot) or collectively (i.e., one gate controls some or all quantum dots).

Practice of the invention does not depend critically on the location of the gate electrode(s), as long as the gate electrode (s) is/are close enough to the quantum dot(s) to provide capacitively coupled tuning of the quantum dot energy levels. Suitable separations between gate electrodes and quantum dots for this purpose are known in the art. Preferably this separation is in a range from 1 nm to 200 nm.

Figure 5A:
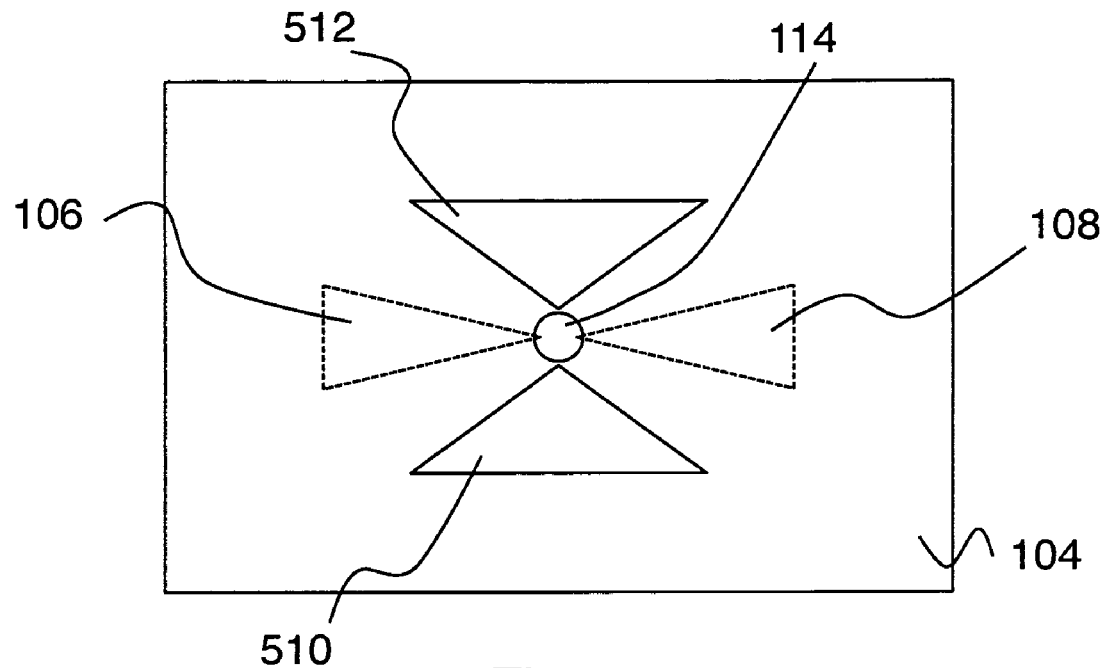
FIGS. 5a-b show top and side views of a further embodiment of the invention.
Figure 5B:
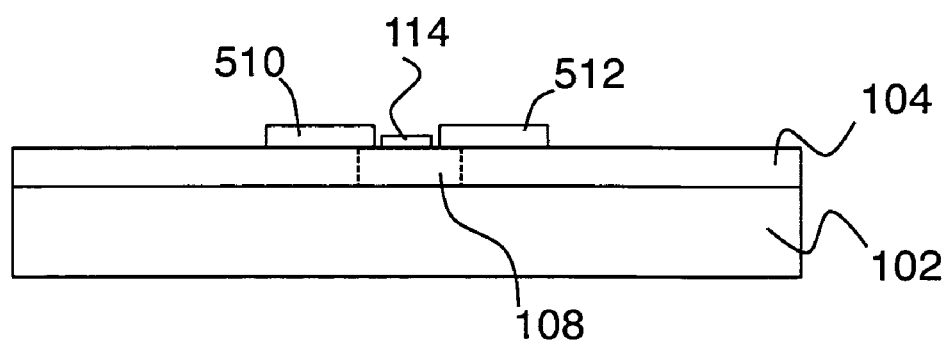

In the preceding examples, the gate electrodes have been disposed on the top surface of substrate 102 (i.e., in the same plane as the source/drain electrodes). This is not required, and it is also possible for the gate electrodes to be disposed on top of insulating layer 104 (i.e., in the same plane as quantum dot 114). FIGS. 5a-b show top and side views of an embodiment of the invention having this feature. Here gate electrodes 510 and 512 are disposed on top of insulating layer 104, and in the same plane as quantum dot 114. This can most easily be seen in the side view of FIG. 5b, which is a view looking to the left on FIG. 5a. The gate electrodes can also be disposed above quantum dot 114. For example, a second insulating layer can cover quantum dot 114, and then the gate electrodes can be disposed on this second insulating layer near/above the quantum dot. As another possibility, the gate electrodes can be embedded in insulating layer 104 without touching substrate 102.

In the preceding examples, the quantum dot is out of the plane of the source and drain electrodes because the quantum dot is on top of an insulating layer which is on top of the source and drain electrodes. Any other structure for getting the quantum dot out of the plane of the source and drain electrodes can be employed. In such structures, vertical tunneling occurs between the quantum dot(s) and the source/ drain electrodes. The quantum dot can be disposed below the source and drain electrodes, or the source and drain could be in different planes, and the quantum dot could be in a third plane different from the electrode planes. These arrangements can all be regarded as having laterally separated source and drain electrodes where current between source and drain can be controlled by controlling vertical tunneling between the source/drain electrodes and the quantum dot(s). The quantum dot(s) are vertically separated from the source and drain electrodes.

The invention claimed is:

1. Apparatus comprising:
   a) a source electrode;
   b) a drain electrode laterally separated from said source electrode;
   c) a quantum dot vertically separated from said source electrode and vertically separated from said drain electrode, wherein the quantum dot and the source electrode laterally overlap, and wherein the quantum dot and the drain electrode laterally overlap; and
   d) a gate electrode capacitively coupled to said quantum dot;
   wherein current can flow between said source electrode and said drain electrode by vertical tunneling between said quantum dot and said source electrode, and by vertical tunneling between said quantum dot and said drain electrode; and
   wherein flow of said current can be controlled by altering one or more energy levels of said quantum dot with said gate electrode.

2. The apparatus of claim 1, further comprising:
   a substrate, wherein said source and drain electrodes are disposed on a top surface of said substrate;

an insulating layer, wherein said insulating layer is disposed on said top surface of said substrate and covering part or all of said source and drain electrodes, and wherein said quantum dot is disposed on a top surface of said insulating layer.

3. The apparatus of claim 2, wherein said gate electrode is disposed on said top surface of said substrate.

4. The apparatus of claim 2, wherein said gate electrode is disposed on said top surface of said insulating layer.

5. The apparatus of claim 1, further comprising one or more additional gate electrodes capacitively coupled to said quantum dot.

6. The apparatus of claim 1, wherein said quantum dot has an energy level separation of 26 meV or greater.

7. The apparatus of claim 1, wherein said quantum dot comprises a material that is semi-conducting in bulk.

8. The apparatus of claim 1, wherein said quantum dot comprises a material that is metallic in bulk.

9. Apparatus comprising:
a) a source electrode;
b) a drain electrode laterally separated from said source electrode;
c) two or more quantum dots (QDs) vertically separated from said source electrode and vertically separated from said drain electrode, wherein the two or more quantum dots include a first QD and a second QD, wherein the first QD and the source electrode laterally overlap, and wherein the second QD and the drain electrode laterally overlap; and
d) a gate electrode capacitively coupled to at least one of said quantum dots;
wherein current can flow between said source electrode and said drain electrode by vertical tunneling between the first QD and said source electrode, and by vertical tunneling between the second QD and said drain electrode; and
wherein flow of said current can be controlled by altering one or more energy levels of said at least one of said quantum dots with said gate electrode.

10. The apparatus of claim 9, further comprising:
a substrate, wherein said source and drain electrodes are disposed on a top surface of said substrate;
an insulating layer, wherein said insulating layer is disposed on said top surface of said substrate and covering part or all of said source and drain electrodes, and wherein said quantum dots are disposed on a top surface of said insulating layer.

11. The apparatus of claim 10, wherein said gate electrode is disposed on said top surface of said substrate.

12. The apparatus of claim 10, wherein said gate electrode is disposed on said top surface of said insulating layer.

13. The apparatus of claim 9, wherein said quantum dots each have an energy level separation of 26 meV or greater.

14. The apparatus of claim 9, further comprising one or more additional gate electrodes capacitively coupled to one or more of said quantum dots.

15. The apparatus of claim 9, wherein said quantum dots comprise a material that is semi-conducting in bulk.

16. The apparatus of claim 9, wherein said quantum dots comprise a material that is metallic in bulk.

* * * * *